(12) United States Patent
Keshtbod

(10) Patent No.: US 8,760,914 B2
(45) Date of Patent: Jun. 24, 2014

(54) MAGNETIC MEMORY WRITE CIRCUITRY

(71) Applicant: Avalanche Technology, Inc., Fremont, CA (US)

(72) Inventor: Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/720,327

(22) Filed: Dec. 19, 2012

(65) Prior Publication Data

US 2013/0107614 A1    May 2, 2013

Related U.S. Application Data

(60) Division of application No. 12/125,866, filed on May 22, 2008, now Pat. No. 8,363,457, and a continuation-in-part of application No. 12/040,801, filed on Feb. 29, 2008, now Pat. No. 8,508,984, and a continuation-in-part of application No. 11/674,124, filed on Feb. 12, 2007, now Pat. No. 8,084,835, application No. 13/720,327, which is a continuation-in-part of application No. 11/678,515, filed on Feb. 23, 2007, now Pat. No. 8,058,696, application No. 13/720,327, which is a continuation-in-part of application No. 11/739,648, filed on Apr. 24, 2007, now Pat. No. 8,183,652, and a continuation-in-part of application No. 11/740,861, filed on Apr. 26, 2007, now abandoned, and a continuation-in-part of application No. 11/776,692, filed on Jul. 12, 2007, now Pat. No. 8,063,459, and a continuation-in-part of application No. 11/860,467, filed on Sep. 24, 2007, now Pat. No. 8,018,011, and a continuation-in-part of application No. 11/866,830, filed on Oct. 3, 2007, now abandoned, and a continuation-in-part of application No. 11/932,940, filed on Oct. 31, 2007, now Pat. No. 7,732,881.

(60) Provisional application No. 60/853,115, filed on Oct. 20, 2006, provisional application No. 60/777,012, filed on Feb. 25, 2006, provisional application No. 60/863,812, filed on Nov. 1, 2006.

(51) Int. Cl.
*G11C 11/00* (2006.01)

(52) U.S. Cl.
USPC .......................................... 365/158; 365/171

(58) Field of Classification Search
USPC ........................................ 365/158, 171, 173
See application file for complete search history.

(56) References Cited

U.S. PATENT DOCUMENTS

| 6,504,752 B2 * | 1/2003 | Ito ................................. 365/158 |
| 6,697,294 B1 * | 2/2004 | Qi et al. ................... 365/210.15 |
| 7,755,931 B2 * | 7/2010 | Katou ........................... 365/158 |

FOREIGN PATENT DOCUMENTS

WO    WO 2007015358 A1 *  2/2007

*Primary Examiner* — Harry W Byrne
*Assistant Examiner* — Lance Reidlinger
(74) *Attorney, Agent, or Firm* — Maryam Imam; IPxLAW Group LLP

(57) ABSTRACT

A sensing circuit includes a sense amplifier circuit having a first and second nodes through which a magnetic memory element is sensed. A first current source is coupled to the first node a second current source is coupled to the second node. A reference magnetic memory element has a resistance associated therewith and is coupled to the first node, the reference magnetic memory element receives current from the first current source. At least one memory element, having a resistance associated therewith, is coupled to the second node and receives current from the second current source. Current from the first current source and current from the second current source are substantially the same. The logic state of the at least one memory element is sensed by a comparison of the resistance of the at least one memory element to the resistance of the reference magnetic memory element.

5 Claims, 7 Drawing Sheets

MAGNETIC MEMORY WRITE CIRCUITRY

CROSS REFERENCE TO RELATED APPLICATIONS

This application is a divisional application of U.S. patent application Ser. No. 12/125,866, filed on May 22, 2008, by Parviz Keshtbod, and entitled "Memory Sensing Circuit", which is a continuation-in-part of U.S. application Ser. No. 12/040,801 filed on Feb. 29, 2008, entitled "An Improved Low Resistance High-TMR Magnetic Tunnel Junction and Process for Fabrication Thereof," which is a continuation-in-part of U.S. application Ser. No. 11/674,124 filed on Feb. 12, 2007, entitled "Non-Uniform Switching Based Non-Volatile Magnetic Based Memory," which claims priority to U.S. Provisional Application No. 60/853,115 filed on Oct. 20, 2006 entitled "Non-Uniform Switching Based Non-Volatile Magnetic Based Memory"; and is a further continuation-in-part of U.S. application Ser. No. 11/678,515 filed Feb. 23, 2007, entitled "A High Capacity Low Cost Multi-State Magnetic Memory," which claims priority to U.S. Provisional Application No. 60/777,012 filed Feb. 25, 2006 entitled "A High Capacity Low Cost Multi-State Magnetic Memory"; and is a further continuation-in-part of U.S. application Ser. No. 11/739,648, filed Apr. 24, 2007 entitled "Non-Volatile Magnetic Memory with Low Switching Current and High Thermal Stability"; and is a further continuation-in-part of U.S. application Ser. No. 11/740,861, filed Apr. 26, 2007, titled "High Capacity Low Cost Multi-Stacked Cross-Line Magnetic Memory"; and is a further continuation-in-part of U.S. application Ser. No. 11/776,692, filed Jul. 12, 2007, titled "Non-Volatile Magnetic Memory Element with Graded Layer"; and is a further continuation-in-part of U.S. application Ser. No. 11/860,467 filed Sep. 24, 2007, titled "Low cost multi-state magnetic memory"; and is a further continuation-in-part of U.S. application Ser. No. 11/866,830 filed Oct. 3, 2007 entitled "Improved High Capacity Low Cost Multi-State Magnetic Memory"; and is a further continuation-in-part of U.S. application Ser. No. 11/932,940 filed Oct. 31, 2007 entitled "Current-Confined Effect of Magnetic Nano-Current-Channel (NCC) for Magnetic Random Access Memory (MRAM)," which claims priority to U.S. Provisional Application No. 60/863,812 filed Nov. 1, 2006 entitled "Novel Spintronic Device."

BACKGROUND OF THE INVENTION

1. Field of the Invention

The present invention relates generally to magnetic memory element and particularly to sensing (or reading) of and writing to the magnetic memory element and an array made of the same.

2. Description of the Prior Art

Computers conventionally use rotating magnetic media, such as hard disk drives (HDDs), for data storage. Though widely used and commonly accepted, such media suffer from a variety of deficiencies, such as access latency, the data not being randomly accessible, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles. The flash-type non-volatile memories are typically capable of writing one type of data randomly (e.g. 0's), to write other types of data a larger section of the memory needs to be erased.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and RAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic Ram (or phase-change memory), Ferromagnetic Ram (FeRAM), current Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, such as requiring too much current or having a large cell size or not readily scalable, there have been advances made in this field in recent years. Current MRAM designs seem to lead the way in terms of its progress in the past few years to replace all types of memories in the system as a universal memory solution.

An MRAM element generally consists of a magnetic tunnel junction (MTJ) and an access transistor. A magnetic tunnel junction (MTJ) generally consists of a tunneling layer, such as one made of magnesium oxide (MgO) formed between two magnetic layers.

Electron current tunneling through the tunneling layer depends on the orientation of the two magnetic layers. If the magnetic orientations of the two magnetic layers are parallel, electrons have a relatively easy time tunneling through the tunneling layer, otherwise, tunneling is difficult and some of the electrons are reflected at the interface. Therefore, the total resistance of the MTJ is less when the directions of the magnetic orientation of the magnetic layers are parallel relative to each other. If the resistance of the MTJ is Rl (or $R_{low}$) when the magnetic directions are parallel, and Rh (or $R_{high}$) when they are anti-parallel, the relative change of resistance is defined as $(R_h-R_l)/Rl$, which is a measurement of tunneling magnetic resistance (TMR). That is, the following equation defines TMR as:

$$TMR=(Rh-Rl)/Rl \qquad \text{Eq. (1)}$$

The first time a product is manufactured, the magnetic orientations in all the MTJs are typically in the same direction, such as in a parallel state. Therefore, the resistances of all the memory elements are at $R_l$. After writing a "1" (or an active logic state, which may be considered "0" in certain cases), the resistance changes to $R_h$. Due to noise and other natural variances in the manufacturing process and write operations, the value of the resistances ($R_l$ or $R_h$) form a Gaussian distribution around certain $R_{low\_avg}$ and $R_{high\_avg}$. In reading a memory cell, which includes a memory element, its resistance is determined and based on its detected resistance, its logical state is determined as being a "0" or "1". To do so, the memory cell resistance is compared to a resistor with the average value of Ravg=$(R_{low\_avg}R_{high\_avg})/2$. When the $R_{high}-R_{avg}$ is larger than a certain value V0 for a particular memory cell, the cell is read as "1", and when $R_{avg}-R_{low}$ is larger than V0 for a particular memory cell, the cell is read as "0". If the values are less than V0, the memory cell state is undetermined and can not be read. The V0 value is related to the sensitivity of the sense amplifier. For instance, the value of V0 is smaller for more sensitive sense amplifier.

However, one of the problems associated with the foregoing is that the value of the V0 can not be lowered indefinitely because of the presence of thermal noise as well as noise generated by the switching of signals from one state to another. This requires the value of V0 to be larger than Vnoise by several orders of magnitude.

What is needed is a circuit for reliably sensing and writing to MRAM memory cells.

SUMMARY OF THE INVENTION

To overcome the limitations in the prior art described above, and to overcome other limitations that will become apparent upon reading and understanding the present specification, the present invention discloses a design method and a corresponding structure for a magnetic storage memory device that is based on spin current-induced-magnetization-switching having reduced switching current in the magnetic memory.

Briefly, an embodiment of the present invention includes a sensing circuit having a sense amplifier circuit having a first and second nodes through which a magnetic memory element is sensed. A first current source is coupled to the first node a second current source is coupled to the second node. A reference magnetic memory element has a resistance associated therewith and is coupled to the first node, the reference magnetic memory element receives current from the first current source. At least one memory element, having a resistance associated therewith, is coupled to the second node and receives current from the second current source. Current from the first current source and current from the second current source are substantially the same. The logic state of at least one memory element is sensed by a comparison of the resistance of the at least one memory element to the resistance of the reference magnetic memory element.

In another embodiment, a magnetic memory write circuit is disclosed to include a magnetic memory element coupled to a bit line on one end and an access transistor coupled to an opposite end of the magnetic memory element and operative to select the magnetic memory element to be read or written thereto. The access transistor is further coupled to a word line, the magnetic memory element are selected to be read from or written to when the bit line and word line are activated. A first inverter has an output coupled to the bit line and an input coupled to an input of the magnetic memory write circuit and a second inverter has an input coupled to the input of the magnetic memory write circuit and further having an output and a third inverter has an input coupled to the output of the second inverter and an output coupled to the source of the access transistor and to ground.

These and other objects and advantages of the present invention will no doubt become apparent to those skilled in the art after having read the following detailed description of the preferred embodiments illustrated in the several figures of the drawing.

IN THE DRAWINGS

Figure 4:
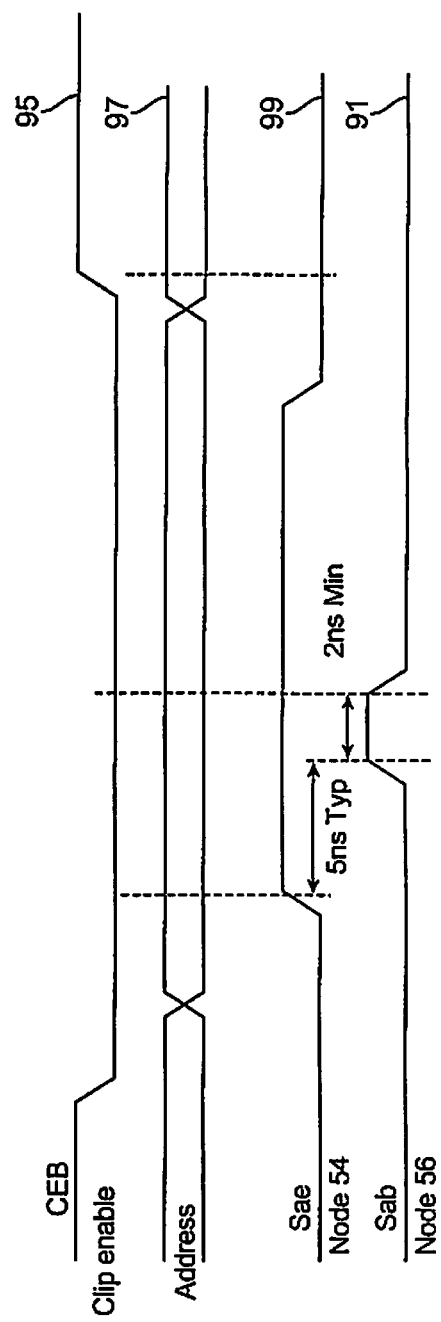

FIG. 4 shows a timing diagram of the nodes 54 and 56. The node 54 generates the signal 99 and the node 56 generates the signal 91.

Figure 5:
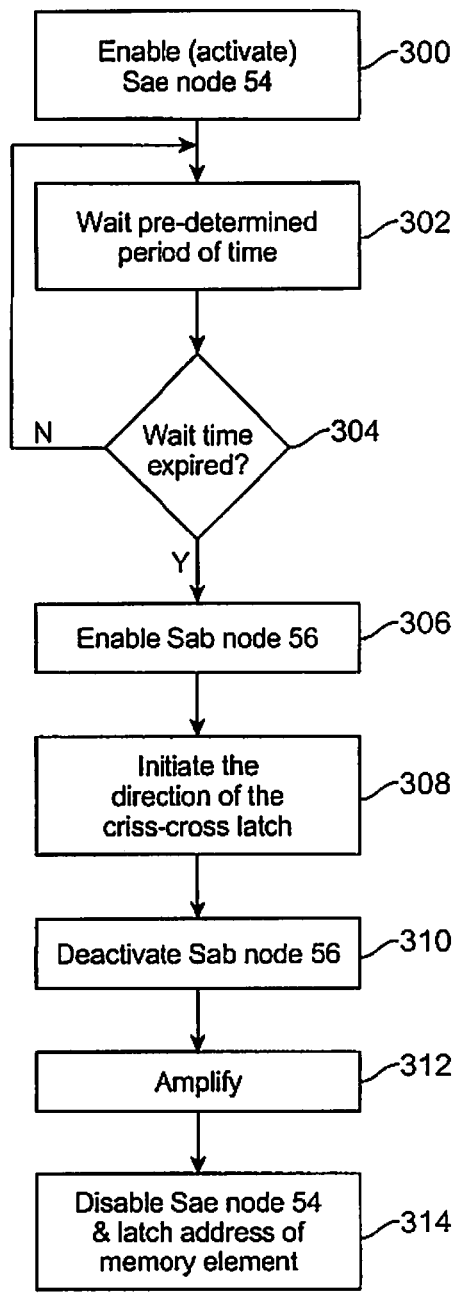

FIG. 5 shows a flow chart of the steps performed by the sense amplifier 230 when sensing a memory element such as the memory element 100.

Figure 6:
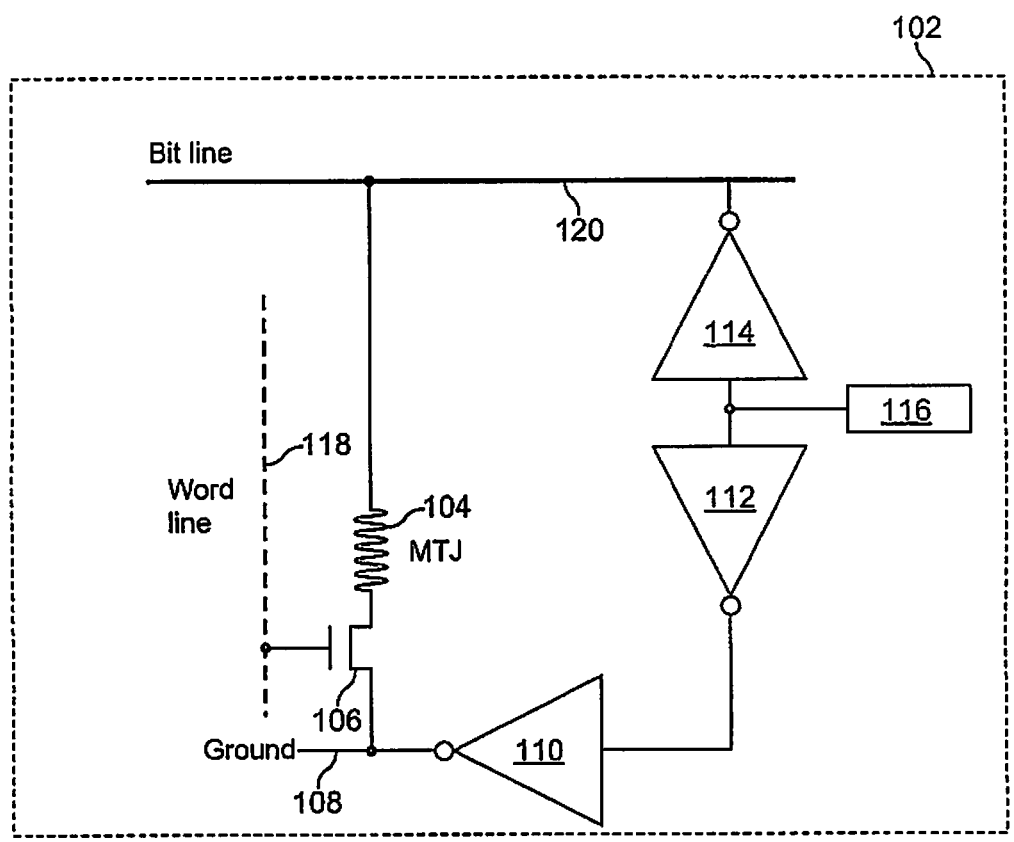

FIG. 6 shows a write circuit 102, in accordance with an embodiment of the present invention.

Figure 7:
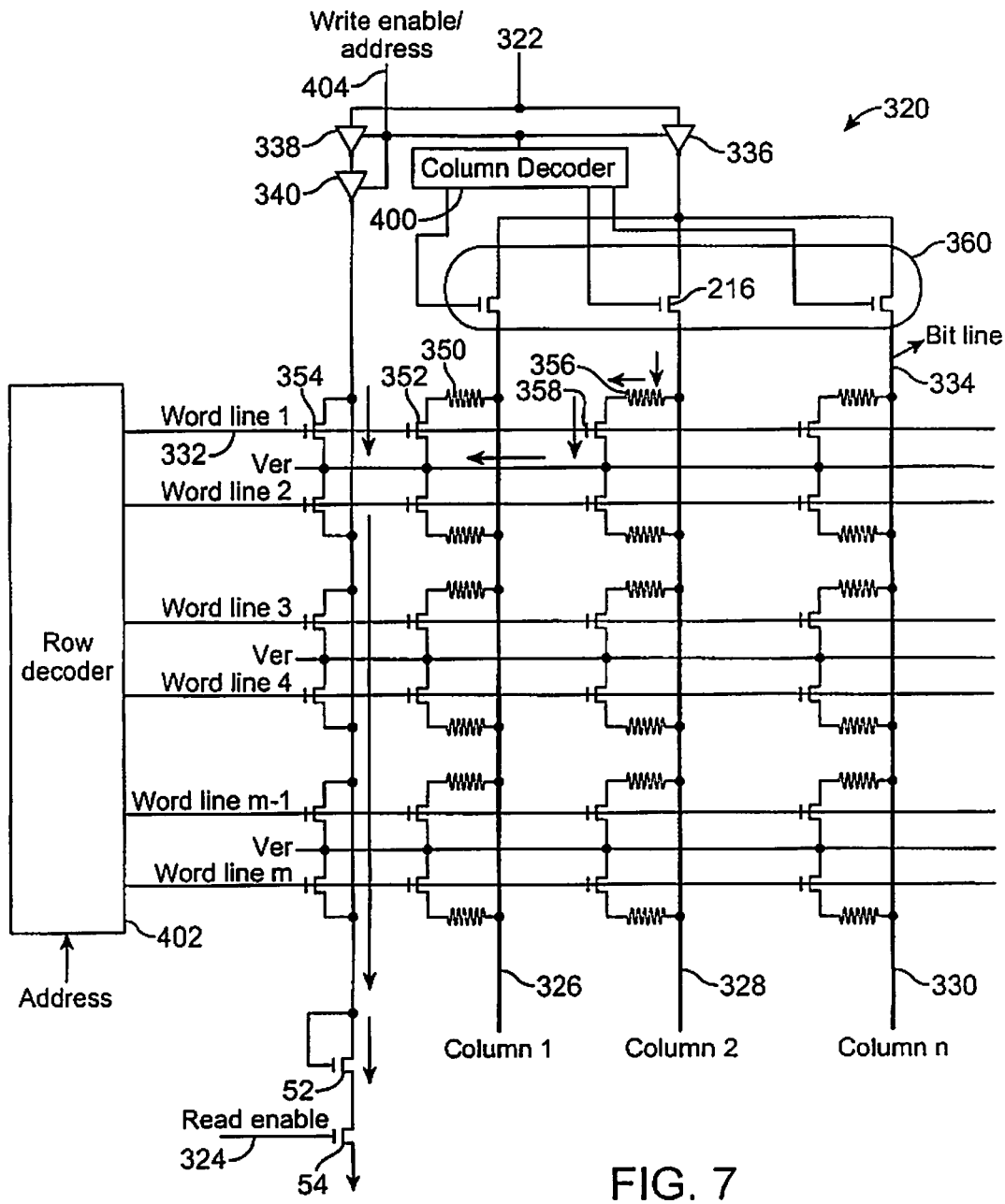

FIG. 7 shows a memory array 320 made of magnetic memory elements and including circuits for reading and writing to the same, in accordance with an embodiment of the present invention.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

It is understood that as used herein "magnetic memory element", "memory element", "reference magnetic memory element" or "reference memory element", or "magnetic random access memory (MRAM)" all refer to magnetic memory that is made of MTJ. Various embodiments of the structure used for a memory element are shown and discussed in the following documents:

U.S. application Ser. No. 11/674,124, filed Feb. 12, 2007, titled "Non-Uniform Switching Based Non-Volatile Magnetic Based Memory" by Ranjan et alia, U.S. application Ser. No. 11/678,515, Filed Feb. 23, 2007, titled "A High Capacity Low Cost Multi-State Magnetic Memory" by Ranjan et alia, U.S. application Ser. No. 11/739,648 Filed Apr. 24, 2007, titled "Non-volatile Magnetic Memory With Low Switching Current and High Thermal Stability" by Ranjan et alia, U.S. application Ser. No. 11/776,692, filed Jul. 12, 2007, titled "Non-Volatile Magnetic Memory Element with Graded Layer" by Ranjan et alia, U.S. application Ser. No. 11/740,861, filed Apr. 26, 2007, titled "High Capacity Low Cost Multi-Stacked Cross-Line Magnetic Memory" by Ranjan et alia, U.S. Application No. 60/863,812, filed Nov. 1, 2006, titled "Novel Spintronic Device" by Wang, U.S. application Ser. No. 11/932,940 filed Oct. 31, 2007 titled "Current-Confined Effect Of Magnetic Nano-Current-Channel (NCC) For Magnetic Random Access Memory (MRAM)" by Wang;

U.S. application Ser. No. 11/866,830 filed Oct. 3, 2007, titled "Improved High Capacity Low Cost Multi-State Magnetic Memory" by Ranjan et alia;

U.S. application Ser. No. 11/860,467 filed Sep. 24, 2007, titled "Low cost multi-state magnetic memory" by Ranjan et alia; and U.S. application Ser. No. 12/040,801, filed on Feb. 29, 2008, titled "An Improved Low Resistance High-TMR Magnetic Tunnel Junction and Process For Fabrication Thereof" by Ranjan, the disclosures of which are incorporated herein by reference as though set forth in full.

In various embodiments of the present invention, a reference magnetic memory element is used to read magnetic memory elements. The reference magnetic memory element is similar to any one of the magnetic memory elements being read or written and is therefore an MRAM element and ideally has associated therewith a resistance value of $R_{avg}=(R_{low\_avg}+R_{high\_avg})/2$, which is then used to as a reference resistance in reading the MRAM memory elements. As noted earlier, the MRAM memory elements each include an MTJ. However, since the exact shape of the MTJ resistance distribution when the memory elements are first manufactured remains unknown, making a memory element that has a resistance value represented by:

$$R_{avg}=(R_{low\_avg}+R_{high\_avg})/2 \quad \text{Eq. (2)}$$

is difficult. $R_{avg}$ is the average resistance of the low resistance values $R_{low\_avg}$ and the average of the high resistance values $R_{high\_avg}$. Thus, in place of $R_{avg}$, which represents more of an exact average resistance value, a resistance value of $R_v$ is used in accordance with the following relationship:

$$R_v=(R_{low}+R_{high})/2 \quad \text{Eq. (3)}$$

$R_v$ is obviously different from $R_{avg}$ in that it is the average of low and high resistance values rather than an average of the same, therefore, causing more difficulty in sensing (or reading of the memory elements).

Figure 1:
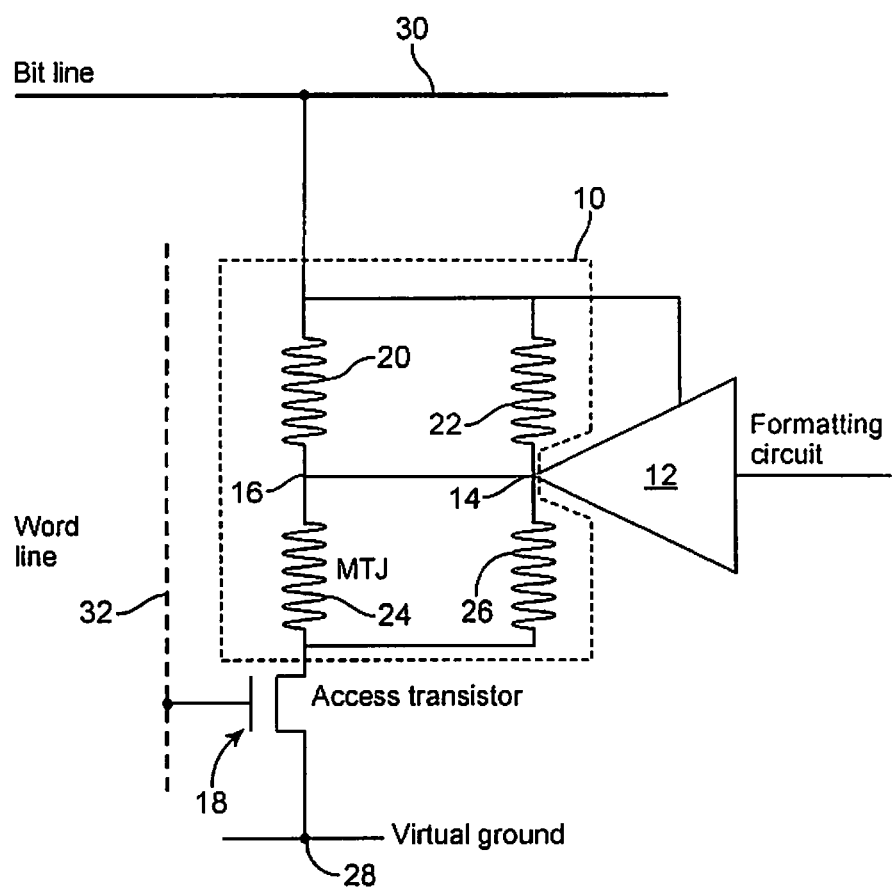
FIG. 1 shows the structure of a reference magnetic memory element, in accordance with an embodiment of the present invention.

Referring now to FIG. 1, the structure of a reference magnetic memory element 10, in accordance with an embodiment of the present invention. The reference element 10 is shown to include MTJs 20, 22, 24 and 26 and has a resistance value represented by $R_v$ of Eq. (3), in accordance with an embodiment of the present invention. The MTJs 20, 22, 24 and 26, initially each have a resistance value of $R_{low}$. This is because the first time MRAM elements are manufactured, their resistances are set to $R_{low}$.

MTJs 20 and 22 are coupled together in parallel and the MTJs 24 and 26 are coupled together in parallel. The MTJ 20 is coupled, in series, with the MTJ 24, at a node 16, and the MTJ 22 is coupled, in series, with the MTJ 26 at a node 14.

A formatting circuit 12 is shown coupled, at its output, to the MTJs 22 and 26 at the node 14. The MTJs 20 and 22 are coupled to the formatting circuit at its control gate. The formatting circuit 12 functions as an amplifier which pumps programming current through the MTJs 20 and 22, changing their resistance values to $R_{high}$. The MTJs 24 and 26 are connected at ends (or nodes) opposite to the nodes 16 and 14, respectively, to a source of an access transistor 18. The gate of the access transistor 18 is coupled to the word line 32 and the drain of the access transistor 18 is coupled to virtual ground. Virtual ground, as used herein, refers to a node that is maintained at a steady reference potential (or voltage level) (during read operations) while fluctuating between at least two states (or voltage levels) during write operations. The MTJs 20 and 22 are coupled at nodes opposite to the nodes 16 and 14, respectively, to a bit line 30.

In operation and before the memory elements are tested, a formatting operation is performed by activating the formatting circuit 12, at its input thereby causing programming of the MTJ 20 and 22 under average conditions, which results in increasing the resistance values of the MTJs 20 and 22 to $R_{high}$. The collective resistance value of the MTJs 20 and 22 is represented by the average of $R_{low}$ and $R_{high}$ or the following equation:

$$R_{avg}=(R_{low}+R_{high})/2 \quad \text{Eq. (4)}$$

Tunneling magnetic resistance (TMR) is defined as:

$$TMR=(R_{high}-R_{low})/R_{low} \quad \text{Eq. (5)}$$

Relative to TMR, the $R_{high}$ is defined as:

$$R_{high}=R_{low}*(1+TMR) \quad \text{Eq. (6)}$$

and $R_{avg}$ is defined as:

$$R_{avg}=R_{low}*(1+TMR/2) \quad \text{Eq. (7)}$$

During a read operation, the resistance values of the selected MTJ within a memory array (or the MTJ that is selected to be read) is compared to the average resistance formed by the MTJs 20, 22, 24 and 26. If the resistance value of the selected MTJ is higher than $R_{avg}$, the result is a logical state '1', and if it is less than $R_{avg}$ the result is logical state '0', or vice versa.

The average resistance, while perhaps not representing the exact average, as the average changes due to manufacturing and other factors, represents a resistance value that is close to an average of the high and low resistances. As the high and low resistances may not be absolute in and of themselves, with a variance associated with each, the average resistance, using the method and apparatus of the embodiments of the present invention, is close enough to a middle range so as to avoid mis-write or mis-read.

As previously noted, a magnetic memory element includes an MTJ made of a tunneling (or barrier) layer sandwiched between two magnetic layers. One of the magnetic layers is typically a free layer whose magnetic orientation transitions from one that is parallel to that of the other magnetic layer (known as the fixed layer) to one that is anti-parallel to that of the fixed layer. The thickness of the tunneling layer and the physical size of the memory element, upon which TMR is based, generally determine the resistance values to which the resistors 20-26 should be set. This is evidenced by the equations above. As an example, where the thickness of the tunneling layer is 10 to 15 A and the physical size of the memory element is 0.1 to 0.2 u2, a $R_{high}$ resistance value is 1400 ohms and a $R_{low}$ resistance value is 600 ohms with an average resistance of 1000 ohms. Therefore, the resistance of a magnetic memory element that is to be read is compared to 1000 ohms and if it is higher, for example, the memory element may be declared as being at a high logic state and if it is lower than 1000 ohms, the memory element may be declared as being at a low logic state. Thus, rather than simply using a reference voltage to compare to in determining the logical state of a memory element, as done by prior art techniques, in one embodiment of the present invention, the average value of the resistance of two MTJs are used to compare to the resistance of the MTJ (or memory element) being read.

Figure 2:
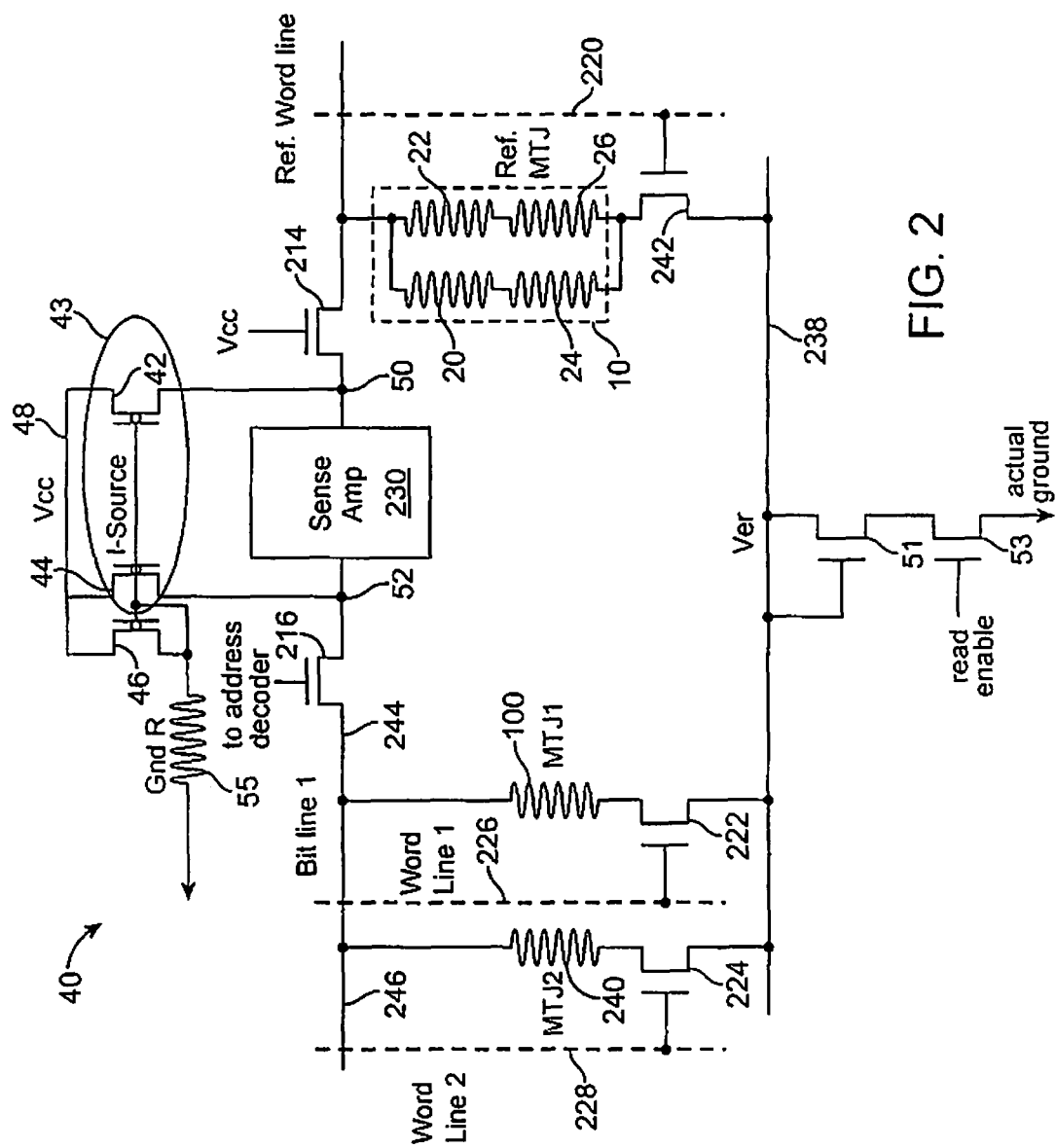
FIG. 2 shows a sensing circuit, in accordance with an embodiment of the present invention.

FIG. 2 shows a magnetic memory sensing circuit 40 for sensing (or reading) the state of a magnetic memory element 100, which is made of a MTJ or the state of the magnetic memory element 240, which is also made of a MTJ, using the reference memory element 10, in accordance with an embodiment of the present invention. As used herein, a memory element includes a MTJ and a memory cell includes a memory element and a corresponding access (or select) transistor.

Memory element 100 and memory element 240 may be each made of any of the memory elements shown and discussed in the following patent document:

memory element are shown and discussed in the following documents:

U.S. application Ser. No. 11/674,124, filed Feb. 12, 2007, titled "Non-Uniform Switching Based Non-Volatile Magnetic Based Memory" by Ranjan et alia, U.S. application Ser. No. 11/678,515, Filed Feb. 23, 2007, titled "A High Capacity Low Cost Multi-State Magnetic Memory" by Ranjan et alia, U.S. application Ser. No. 11/739,648 Filed Apr. 24, 2007, titled "Non-volatile Magnetic Memory With Low Switching Current and High Thermal Stability" by Ranjan et alia, U.S. application Ser. No. 11/776,692, filed Jul. 12, 2007, titled "Non-Volatile Magnetic Memory Element with Graded Layer" by Ranjan et alia, U.S. application Ser. No. 11/740,861, filed Apr. 26, 2007, titled "High Capacity Low Cost Multi-Stacked Cross-Line Magnetic Memory" by Ranjan et alia, U.S. Application No. 60/863,812, filed Nov. 1, 2006, titled "Novel Spintronic Device" by Wang, U.S. application Ser. No. 11/932,940 filed Oct. 31, 2007 titled "Current-Confined Effect Of Magnetic Nano-Current-Channel (NCC) For Magnetic Random Access Memory (MRAM)" by Wang;

U.S. application Ser. No. 11/866,830 filed Oct. 3, 2007, titled "Improved High Capacity Low Cost Multi-State Magnetic Memory" by Ranjan et alia;

U.S. application Ser. No. 11/860,467 filed Sep. 24, 2007, titled "Low cost multi-state magnetic memory" by Ranjan et alia; and U.S. application Ser. No. 12/040,801, filed on Feb. 29, 2008, titled "An Improved Low Resistance High-TMR Magnetic Tunnel Junction and Process For Fabrication Thereof" by Ranjan.

In FIG. 2, the sensing circuit 40 is shown to include a sense amplifier circuit 230 coupled to a decoding transistor 214 and further coupled to a decoding transistor 216, at their source. The drain of the transistor 214 is shown coupled to the reference memory element (MTJ) 10 and serves as a reference bit line. The reference memory element 218 is further shown coupled to a transistor 242 at the drain of the transistor 242. The gate of the transistor 242 forms a reference word line 220 and the source of the transistor 242 forms the virtual ground (Ver) 238, which is shown coupled to the source of the transistor 222.

The drain of the transistor 222 is shown coupled to the memory element 100 and an opposite end of the memory element 100 is shown coupled to the drain of the transistor 216 forming the bit line 1 244. The source of the transistor 222 is shown coupled to the source of the transistor 224 and to the source of the transistor 242 forming Ver 238. The gate of the transistor 224 is shown to form the word line 2 228. The drain of the transistor 224 is shown coupled to the memory element 240, which on an opposite end thereto, forms the bit line 2 246.

Ver 238 is shown coupled to the drain of the transistor 51, which has its gate coupled to the same, i.e. Ver 238. The source of the transistor 51 is shown coupled to the drain of the transistor 53, which has its source coupled to (actual) ground. The gate of the transistor 53 is coupled to the read enable signal 324, which serves to initiate a read operation. The gate of the transistor 53, 60 goes high during read operation and is grounded during write operation of the selected MTJ.

The gate of transistor 216 is coupled to an address decoder (not shown). In some embodiments, the transistor 216 is part of an address decoder, which selects which memory element is to be read or written thereto. In the embodiment of FIG. 2, the transistor 216 might select the memory element 100 while another transistor of the address might select the memory element 240. The gate of the transistor 214 is shown coupled to Vcc (or a high state). The transistors 52, 54, 216, 214, 222, 221 and 242 are each of the NMOS type of transistors Transistors 42, 44 and 46 are shown coupled in parallel relative to each other with the drains thereof being coupled to high voltage defining a power supply (or Vcc). The drains of transistors 42 and 44 are each shown coupled to either sides of the sense amplifier 230. That is, the drain of the transistor 42 is shown coupled between the sense amplifier 230 and the drain of the transistor 214 at reference magnetic memory element sensing node 50 and the drain of the transistor 44 is shown coupled between the sense amplifier and the source of the transistor 216 at magnetic memory element sensing node 52. The drain of the transistor 46 is shown coupled to the resistor 55, which on an apposite end thereof, is shown coupled to (actual) ground.

The sense amplifier 230 senses potential or voltage levels at the nodes 50 and 52 and compares them to determine which has a higher potential which is related to the higher resistance of the MTJs. This is done because of the well-known relationship between voltage (V) being resistance (R) multiplied by current (I). If the voltage at 52 is determined to be higher than that of the voltage at 50, the resistance of the memory element 100 is then known to be higher than that of the memory element 10, thus, declaring the memory element 100 to be at high state. Otherwise, if the voltage at node 52 is determined to be lower than that at node 50, the memory element 100 is determined to be at low state. It is understood that the opposite may be implemented in that the voltage at node 52 being higher than that of node 50 yielding a low state and the voltage at node 52 being lower than that of the mode 50 yielding a high state.

The transistors 42 and 44 and 46 function as current sources, providing substantially the same amount of current through the reference memory element 10 and each of the memory elements 100 and 240. That is, the current generated by the current source (or transistor 42) to the memory element 100 or the memory element 240 is substantially identical, in amount, to the current generated by the current source (or transistor) 42 to the memory element 10. The current source 43 is shown made of the transistors 42, 44 and 46 and their connections to each other.

In one embodiment of the present invention, the logical state of each of the memory elements 100 and 240 is easily measured by comparing the resistance of each to that of the reference memory element 10. This is done because the resistance of the reference memory element 10 is known, as previously discussed, and being that the current supplied to the reference memory element 10 and each of the memory elements is the same, the resistance of the latter is determined relative to the former. For example, if the resistance of the memory element 100 is determined to be higher than that of the reference memory element 10, the logic state of the memory element 100 may be determined as being 'high' or '1', whereas, if the resistance of the memory element 100 is determined to be lower than that of the reference memory element 10, the logic state of the memory element 100 may be determined as being 'low' or '0', alternatively, the reverse of these states may be determined. It is understood that while two memory elements 100 and 240 are shown in FIG. 2, any number of memory elements may be employed and their states read in accordance with the foregoing.

The transistors 51 and 53 are formed between the memory elements and actual ground because the amount of voltage generated due to the current flowing through the MTJ is very low. This is because the currents generated by the current sources are substantially approximately in the micro amperes range. Since the resistance of the MTJs is approximately in the kilo ohms range, the voltage generated across the MTJs is in the milli-volts range. The threshold of the sensing elements in the sense amplifier is larger than this. The transistor 51 is employed to bias the voltage to a larger value in order to activate the transistor in the sense amp. The threshold of the transistor 51 is Vt, so that the voltage at the gate of the sensing element being read is Vt+V0, with V0 being the voltage generated by the MTJ resistor.

The function of the transistor 46 and the resistor 55 is to set the current value for the current sources 42 and 44. That is, the resistance value of the resistor 55 determines the amount of current to be supplied by each the current sources 42 and 44. Ideally, an identical amount of current is supplied by each of the current sources 42 and 44 to the memory element 10 and the memory elements to be read (or sensed).

During a read (or sensing) operation, the sense amplifier circuit 230 compares the resistance of the memory element 100 (of the selected cell) to the resistance of the reference memory element 10. The resistance of the cell 10 is designed to be (R1+R2)/2, where R1 is the resistance of the memory element 100 in a low state and R2 is the resistance of the memory element 100 in high state. The high and low states are based on the description provided above where the low state has a characteristic of being at least half of the resistance of that of the high state. The magnetic orientation of the fixed and the free layers, i.e. the two magnetic layers of the MTJ of the memory cell being read, are parallel relative to each other at a low state and at a high state, the magnetic orientation of the fixed and free layers are anti-parallel relative to each other.

In one embodiment of the present invention, the sense amplifier 230 is a bi-stable latch or any such device, which flips between logic states based on the state of the resistance. For example, if resistance is low, the state will be that of a low state and if resistance is high, the state will be that of a high state.

It should be noted that the magnetic memory elements 100 and 240 are two of many magnetic memory elements coupled to bit line 244. The transistors 222 and 224 are used to select one of these magnetic memory elements based on the selection of one of the word lines 226 or 228. When a word line is selected, it is biased with the appropriate potential required to turn on the selected transistors. When one of the transistors 222 or 224 is selected, the memory element 100 is caused to be coupled to the circuit 230, at 231, through the transistor 216, which as a decoder circuit. At the same time the reference memory element 10 is selected by the transistor 242 and the word line 220. Thereafter, current flows through the selected transistors, i.e. transistor 222 or 224. The current flowing through the reference memory element 10 is always the same, while current flowing through the selected memory elements, such as the memory element 100 depends on the state of that memory element. That is, if the memory element's state is high, its associated resistance (R) is high with respect to the reference memory elements. Thereafter, less current flows through the selected memory elements than the reference memory element 218, causing the sense amplifier circuit 230, at 233, to enter a high state with respect to that of 233. On the other hand, if the selected memory element is at a low state and has low resistance, its current is high with respect to that of the reference memory element 218 and the voltage at 231 drops. In this manner, the voltage at 231 determines the state of the selected memory element.

The current provided by the current source 43 is at least, in part, controlled by the resistance value of the resistor 50. Programming or writing of the memory cells 240 or 100 is also done by forcing high current through the magnetic memory cells being read, however, the read current can not be too high. High read currents can cause undesirable programming of the memory cells (or memory elements), which is commonly referred to as "read disturbance". Therefore, the read current needs to be below a certain critical current. This critical current depends on the MTJ size. In an exemplary embodiment, the read current is less than 40 uA (micro amps).

As currents flows through the memory cell and the reference memory cell, certain amount of voltage appears at the two ends of the sense amplifier circuit 230. If the MTJ is programmed to a high resistance value ($R_{high}$), the voltage on the MTJ side of the sense amplifier 230, such as the voltage of the memory cell 100, is higher than the voltage of the other side of the sense amplifier, such as the side with the reference memory element 10, by the following difference voltage (DV):

$$DV = Iread*(R_{high} - R_{avg}) = Iread*R_{low}*TMR/2 \quad \text{Eq. (8)}$$

If the memory element being read is programmed to a low logical state, such as '0', the voltage on of the sense amplifier circuit 230 side that has the memory element being read, such as the side having the memory element 100 is lower by:

$$DV = Iread*(R_{low} - R_{avg}) = Iread*R_{low}*TMR/2 \quad \text{Eq. (9)}$$

The typical values for TMR, Iread and $R_{low}$ are 1, 40 uA and 1 Kilo Ohms, respectively. Therefore a typical DV is approximately 20 milli Volts (mV). As earlier indicated, the resistance values of the MTJ in a memory product are not the same all the time, partly due to varying conditions under which such products are manufactured. For example, the thickness of the tunneling layer as well as the size of the memory element would vary the characteristics of the memory elements.

Thus, the resistance values of the MTJ in a memory product generally follow a Gaussian distribution with highs and lows. This effectively reduces the DV in reading of different cells under different conditions. Therefore, the product requires a sensitive sense amplifier circuit, such as the sense amplifier 230. A sensitive amplifier circuit however, can undesirably amplify noise and disturbances of the circuit. To overcome this problem, sensing is slightly delayed, allowing undesirable disturbances caused by switching of signals to subside.

Figure 3:
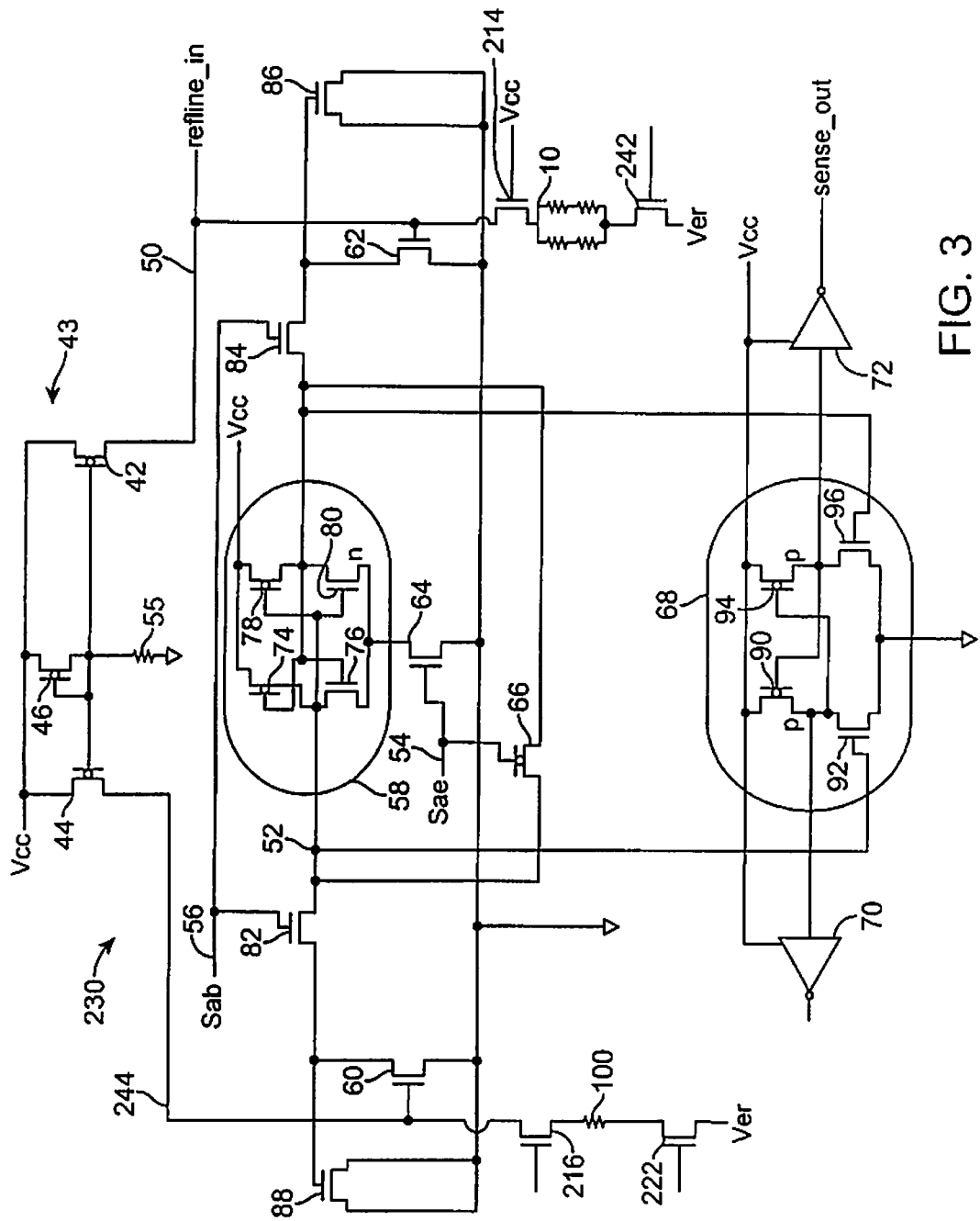
FIG. 3 shows relevant details of the sense amplifier circuit 230, in accordance with an embodiment of the present invention.

FIG. 3 shows relevant details of the sense amplifier circuit 230, in accordance with an embodiment of the present invention. The sense amplifier 230 is shown coupled to the current sources 42 and 44 and to the reference memory element 10 and the memory element 100. It is understood that more memory elements may be coupled to the sense amplifier 230 than that shown in FIG. 3.

The sense amplifier 230 is shown to include transistors 88, 60, 82, 66, 64, 84, 62 and 86 and the criss-cross latch 58 and the amplifier circuits 68, 70 and 72. The criss-cross latch 58 is shown to include transistors 74, 76, 78 and 80 and the amplifier circuit 68 is shown to include transistors 90, 92, 94 and 96. Criss-cross latch 58 is well known as are the amplifiers 68, 70 and 72. However, to overcome the problem of undesirable amplification of noise and disturbances caused by the switching of signals associated with the criss-cross latch 58, the sense amplifier 230 advantageously slightly delays sensing of the voltages of the reference memory element and the memory element to be read to allow for the disturbances to subside before beginning sensing.

The transistors 74, 78, 90, 94, 46 and 66 are generally p-type transistors and the transistors 92, 96, 86, 62, 84, 80, 76, 82 and 60 are generally n-type transistors. In FIG. 3, the gate of the transistor 88 is shown coupled to the source of the transistor 60. The source and drain of the transistor 88 are shown coupled to actual ground The A node 56 is shown coupled to the drain of the transistor 82 and the drain of the transistor 60 is shown coupled to ground. The node 52 is further shown coupled to the drain of the transistor 76 and to the source of the transistor 74. The drain of the transistor 60 are shown coupled to ground. The source of the transistor 60 is shown coupled to the drain of the transistor 82. The source of the transistor 82 is shown coupled to the node 52 and its gate is shown coupled to a Sab node 56. The source of the transistor 66 is shown coupled to the node 52, and its drain is shown coupled to the node 50 and its gate is shown coupled to a node Sae 54. The gate of the transistor 64 is shown coupled to the node 54 and its drain is shown coupled to actual ground and its source is shown coupled to the respective sources of each of the transistors 80 and 76. The source of the transistor 84 is shown coupled to the node 50, its drain is shown coupled to the source of the transistor 62 and its gate is shown coupled to the node 56. The source and drains of the transistor 86 are shown coupled to actual ground and its gate is shown coupled to the drain of the transistor 84.

The drain of the transistor 74 is shown coupled to VCC and its source is shown coupled to the node 52 and its gate is shown coupled to the node and the source of the transistor 78. The source of the transistor 76 is shown coupled to the node 52 and the gate of the transistor 76 is shown coupled to the gate of the transistor 74 and the drain of the transistor 76 is shown coupled to the source of the transistor 64. The gate of the transistor 80 is shown coupled to the node 52, its drain is shown coupled to the node 50, its source is shown coupled to the source of the transistor 64. The source of the transistor 78 is shown coupled to Vcc, its gate is shown coupled to the node 52 and to the gate of the transistor 80 and its drain is shown coupled to the node 50. The gate of the transistor 74 is shown coupled to the node 50, its drain is shown coupled to the node 52 and its source is shown coupled to Vcc.

While the transistors 46, 42 and 44 are shown to be P-type transistors in FIG. 3, they may be of N type, in alternative embodiments. In fact, any type of CMOS or bipolar transistor may be used as these transistors. Alternatively, another type of current source may be employed. It is however desirable to have the current provided by each of the transistors 42 and 44 be substantially equal. In one embodiment of the present invention, the current produced by each one differs by 10% from the other one The drain of the transistor 90 is shown coupled to Vcc, its source is shown coupled to the input of the amplifier 70 and its gate is shown coupled to the input of the amplifier 72. The drain of the transistor 94 is shown coupled to the Vcc and its gate is shown coupled to the input of the amplifier 70 and its source is shown coupled to the amplifier 72. The drain of the transistor 92 is shown coupled to the input of the amplifier 70, its gate is shown coupled to the node 52 and its source is shown coupled to ground. The drain of the transistor 96 is shown coupled to the input of the amplifier 72, its gate is shown coupled to the node 50 and its source is shown coupled to ground.

The amplifier 68 amplifies the output of the criss-cross latch 58 and one of the amplifiers 70 or 72 acts to further amply the output of the criss-cross latch 58. Use of both amplifiers helps to balance the two sides of the criss-cross latch 58 although in alternative embodiments, a single amplifier may be employed. Additionally, the amplifiers 68, 70 and 72 may be one amplifier in other embodiments. It is understood that other combinations of amplifiers may be employed.

In operation, during sensing or reading of a memory element, such as the memory element 100, the latter is advantageously sense not immediately, rather a delay is introduced prior to the time the sense amplifier 230 starts reading. Namely, the address of the memory element to be read is not latched (or captured) until some time after the reading operation starts. This is done by delaying activation of the sense amplifier 230. The delay is a design choice an in an exemplary embodiment is in the order of a couple of nano seconds.

In an exemplary embodiment, upon selection of the memory element 100 by the decoder 216 through the bit line 244, after a predetermined delay, the sense amplifier 230 is activated by raising the voltage at each of the nodes Sab 56 and Sae node 54. The Sae node 54, when activated, causes the activation of the criss-cross latch 58, which stays activated during the remainder of the read operation. Activation of the Sab node 56 causes coupling of the criss-cross latch 58 to the transistors 60 and 62. As earlier indicated, the node 56 is activated for a short period of time, such as a couple of nano seconds. While the node 56 is high (or activated), the two transistors 60 and 62 pull on the different sides of the criss-cross latch 58. That is, the transistor 60 pulls the node 52 and the transistor 62 pulls the node 50. The node with the higher voltage pulls its side of the criss-cross latch 58 toward ground. This makes the criss-cross latch 58 unbalanced with each of the nodes 50 and 52 being at voltage levels different than one another, in fact, when one node raises in potential by a certain amount, the other node lowers in potential by substantially the same certain amount. This trend continues even after the node 56 is deactivated, and one side of the criss-cross latch 58 eventually is driven to ground, indicating the memory element with the higher potential and therefore higher resistance. Accordingly, the potential of each of the nodes 52 and 50 is compared by the criss-cross latch 58 and the result is amplified by amplifiers and ultimately latched. For example, the amplifiers 68 and 72 amplify the signals to solid 0s and 1s.

In summary, in an exemplary embodiment, a memory element and a reference memory element are selected through a decoder. The current sources to each are also activated. The voltages generated by the currents flowing through the memory element and the reference memory element are applied to the gates of the transistors 60 and 62, respectively.

FIG. 4 shows a timing diagram of the nodes 54 and 56. The node 54 generates the signal 99 and the node 56 generates the signal 91. An enable signal, chip enable (CEB) 95 activates a chip or device including an array of memory elements having MTJs, such as the memory elements 100 and 240. Address signals 97 carry the address of the memory element to be sensed.

In one embodiment of the present invention, the decoder transistors 216 and 214 are a part of the address logic that are selected by the address 97 although it is understood that these transistors are two among many others.

After the selection of a memory element by activation of the signal 95 and the indicated address on the address signals 97 the desired memory element is selected, the sense amplifier 230 is activated by raising the voltages at the node 54 followed by raising the voltage at the node 56 for a short time. In an exemplary embodiment, the node 56 is raised or activated 5 nano seconds after activation of the node 54. Activation of the node 56 causes coupling the criss-cross latch 58 of the sense amplifier 230 to the transistors 60 and 62. The node 56 remains activated only for a short time, such as a couple of nano seconds, during which time, the two transistors 60 and 62 pull on the different sides of the criss-cross latch 58 to start the latching process. The criss-cross latch 58 is also known as a "cross-coupled latch".

FIG. 5 shows a flow chart of the steps performed by the sense amplifier 230 when sensing a memory element such as the memory element 100. At step 300, the node 54 is enabled (or activated) and then a predetermined period of time is awaited at 302 and 304, an example of such time is 5 nano seconds. Then the node 56 is enabled. This initiates the direction of the criss-cross latch 58 from the balanced position, i.e. the voltages at each of its sides are off with respect to each other. Next, at step 310, the node 56 is deactivated after which the output of the criss-cross latch 58 is amplified at step 312 and thereafter, the node 54 is disabled and the address of the memory element to be read is latched (or captured or stored).

The time period from enabling the node 56 at step 306 to deactivating it at step 310 is fairly short. This initiates the movements of two sides of the criss-cross latch. When the movements start, they will continue autonomously. FIG. 6 shows a magnetic memory write circuit 102, in accordance with an embodiment of the present invention. The write circuit 102 is a circuit for writing to the magnetic memory element 104, made of a MTJ and is shown to include the memory element 104, an access transistor 106 and the inverters 110-114. Data to the memory element 104 is written at the node 116, in accordance with a method and apparatus of the present invention.

The access transistor 106 is shown to be coupled to the word line 118 at its gate and to virtual ground 108 at its source and to one side of the memory element 104 at its drain. At an opposite side thereof, the memory element 104 is shown coupled to the bit line 120. The memory element 104 and the access transistor 106 collectively comprise a magnetic memory cell. The inverter 114 is shown to receive data at node 116 at its input, which is also coupled to the input of the inverter 112. The output of the inverter 114 is shown coupled to the bit line 120 and the output of the inverter 112 is shown coupled to the input of the inverter 110. The output of the inventor 110 is shown coupled to ground 108 and the source of the transistor 106.

Virtual ground 108 fluctuates between states (or voltage levels ground and Vcc) depending on the logical state being written. That is, it is driven, for example, to a logical state '1', in the case where logical state '1' is being written (or programmed) and it is driven to a state '0', in the case where logical state '0' is being written. Similarly, bit line 120 is driven to a different voltage level, dictating a particular logical state, depending on the logical state being programmed. For example, when programming logical state '1', bit line 120 is driven to logical state '0', in the embodiment of FIG. 6, and when programming logical state '0', bit line 120 is driven to logical state '1'.

The high resistance of the memory element 104 is represented by an active or high logic state "1" and is indicative of the two magnetic layers of its MTJ being in opposite orientation relative to each other. If the two magnetic layers have the same orientation, then the resistance of the memory element 104 is low and this is represented by an inactive or logical state "0". Originally all memory elements are in the "0" state (their two magnetic layers have magnetic moments in parallel). To have the memory element 104 take on a logical state, which is commonly referred to as writing to the memory element, which is, for example a "1" or high logical state, current need be forced to flow from the lower magnetic layer (or fixed layer) of the MTJ toward the top magnetic layer, or the free layer. A state of "1" appears as the data to be written at node 116. Conversely to write "0" current need be forced from the top magnetic layer (free layer) of the memory element 104's MTJ toward its lower magnetic layer (fixed layer).

The write circuit 102 accomplishes the foregoing writing in the following manner. When data, as "1", appears at node 116, the output of the inventor 112 is "0" and the output of inverter 110 is "1", therefore, virtual ground 108 is at a high or active or "1" state. In the meanwhile, the output of the inverter 114 is "0", thus, the bit line 120 is "0" thereby forcing current from the lower magnetic layer of the memory element 104 to its top magnetic layer. When the data at node 116 is "0" or the memory element 104 is to be programmed or written to an inactive state, the reverse occurs and the output of the inverter 112 is "1" causing the output of the inverter 110 or the ground 108 to be "0". In the meanwhile, the output of the inverter 114 is "1" and therefore the bit line 120 is "1" thereby forcing current to flow from the top magnetic layer of the memory element 104 to its lower magnetic layer.

It is understood that the inverters 110-114 can be replaced with any suitable circuit or structure accomplishing an inversion function.

FIG. 7 shows a memory array 320 made of magnetic memory elements and including circuits for reading and writing to the same, in accordance with an embodiment of the present invention. It is understood that the memory element 320 represents a portion of a potentially larger memory array made of additional memory elements. In one embodiment, the array 320 is 4 kilobytes by 16 bits. Furthermore, memory arrays, stacked on top of each other, with each stack including one of more of the memory array 320 are contemplated. Such memory arrays may form three-dimensional arrays.

In FIG. 7, 'n' number of columns (or bit lines) and 'm' number of rows (or word lines) are shown coupled to magnetic memory arrays with 'n' and 'm' being integer values. Magnetic memory elements are represented by a resistor symbol to indicate the resistive behavior thereof. It is understood that magnetic memory elements discussed herein behave like variable resistors with their resistances changing depending upon the orientation of the two magnetic layers of the MTJ thereof. The orientation of the free layer is set by the direction of the write current flowing through the magnetic memory. Each magnetic memory element is shown coupled to its corresponding access transistor, which serves to select the memory element. For example, the magnetic memory element 356, which is analogous to the memory element 100, is shown coupled to access transistor 358, which is analogous to the transistor 222. The access transistor 358 serves to select the memory element 356. A column decoder 400 is shown coupled to a group of bit line select transistors (or decoders) 360, which in this case is 'n' number of transistors. In an exemplary embodiment, the group of transistors 360 includes the transistors 214 and 216. Each of the transistors of the group of transistors 360 serves to select or activate the bit line to which it is coupled when it is activated by the column decoder 400. The input of the column decoder 400 is a part of the memory address provided to the array 320 to select a particular memory element to be written or read. The remainder of the address is provided to the row decoder 402, which selects one of the 'm' number of word lines. The part of the address that is coupled to the column decoder and includes a write enable indicative of the start of a write operation is referred to as 'write enable/address 404.

As earlier noted, the row decoder 402 receives the remainder of the address to the array 320 and based thereupon, activates a word line among the 'm' number of word lines. The activation of a particular word line and a particular bit line serve to select a memory element within the array 320 to be written to or read. The column decoder 400 and the row decoder 402 collectively decode the received address, accordingly activating a particular word line and bit line and thereby selecting a magnetic memory element to be written to or read.

Ver or virtual ground is shown coupled between the source of an access transistor of a word line to the drain of an access transistor of a subsequent word line.

A read enable signal 324 initiates a read (or sensing) operation, which is performed as discussed herein using a reference magnetic memory element, as shown in FIG. 1. The data to be written during a write operation is introduced at node 322 and the write operation takes place as discussed herein with reference to FIG. 6. It is understood that the write circuitry and read circuitry, as shown and discussed herein are simplified in that in an actual design, provisions are made so that the write and read operation do not interfere with each other, as well known to those skilled in the art. Thus, the inverters 338, 340 and 336 are analogous to the inverters of FIG. 6.

In operation, to write to, for example, the memory element 356 current flows in the direction indicated by the arrows starting from the memory element 356, flowing through the transistor 358, through Ver, and back up to the transistor 354 because the word line 332 are active to choose the memory element 356, as would the column 328 be active. The current flows through the transistor 354 back down to Ver and all the way down to the transistor 52 and to the transistor 54.

It is contemplated that the various embodiments of the present invention, such as those of FIGS. 1-7, have a variety of applications. For example, they may be used to replace hard disk drives as storage although, currently the costs may not justify such a substitute but in the future, as costs of memory elements such as those of the present invention decrease, it is anticipated that such a replacement will be practical. Alternatively, they may replace DRAM or other types of dynamic and even static memory and/or other types of memory currently in use. Another application of the various embodiments of the present invention includes the replacement of flash with the advantage that, for example, the memory elements of the embodiments of the present invention can withstand far more programming/writing thereto than the life span experienced by flash cells. The scalability of the embodiments of the present invention allow the same to replace many types of memory or storage devices.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic memory write circuitry comprising:
a magnetic memory element coupled to a bit line on one end, a reference magnetic memory element used to read and write to the magnetic memory element, the reference magnetic memory element including a first magnetic tunnel junction (MTJ), a second MTJ, a third MTJ, and a fourth MTJ, the first MTJ coupled in parallel to the second MTJ, the third MTJ coupled in parallel to the fourth MTJ, the first MTJ being coupled in series with the third MTJ, the second MTJ being coupled in series with the fourth MTJ, each of the first, second, third, and fourth MTJs having associated therewith a resistance value;
an access transistor coupled to an opposite end of the magnetic memory element and operative to select the magnetic memory element to be read or written thereto, the access transistor further coupled to a word line, the magnetic memory element being selected to be read from or written to when the bit line and word line are activated;
a formatting circuit coupled to the second MTJ and the fourth MTJ and operable to apply programming current to the magnetic memory element through the first and second MTJs thereby causing changing of the respective resistance values of the first and second MTJs;
a first inverter having an output coupled to the bit line and an input coupled to an input of the magnetic memory write circuit;
a second inverter having an input coupled to the input of the magnetic memory write circuit and further having an output; and
a third inverter having an input coupled to the output of the second inverter and an output coupled to the source of the access transistor and to virtual ground.

2. The magnetic memory write circuit, as recited in claim 1, wherein a drain of the access transistor being coupled to virtual ground, wherein the virtual ground fluctuates between states depending on the logical state being written.

3. The magnetic memory write circuit, as recited in claim 1, wherein the bit line fluctuates between states depending on the logical state being written.

4. The magnetic memory write circuit, as recited in claim 1, wherein the access transistor has a gate and a source and drain and the gate of the access transistor couples the access transistor to the word line and the source of the access transistor couples the access transistor to ground and the drain of the access transistor couples the access transistor to the magnetic memory element.

5. The magnetic memory write circuit, as recited in claim 1, wherein the first, second, third and fourth MTJs defining a reference magnetic memory element.

* * * * *